United States Patent [19]

Giglia et al.

[11] Patent Number: 4,698,256
[45] Date of Patent: Oct. 6, 1987

[54] ARTICLES COATED WITH ADHERENT DIAMONDLIKE CARBON FILMS

[75] Inventors: Robert D. Giglia, Rye, N.Y.; Richard H. Clasen, West Redding, Conn.

[73] Assignee: American Cyanamid Company, Stamford, Conn.

[21] Appl. No.: 595,845

[22] Filed: Apr. 2, 1984

[51] Int. Cl.[4] .................. B32B 9/00; B05D 1/00
[52] U.S. Cl. ............................ 428/216; 428/408;
428/412; 428/473.5; 428/474.4; 428/480;
428/521; 428/523; 428/457; 428/433; 427/404;
427/34
[58] Field of Search .......... 428/408, 412, 212, 480,
428/216, 473.5, 474.4; 427/34

[56] References Cited
U.S. PATENT DOCUMENTS

| | | | |
|---|---|---|---|
| 2,512,230 | 6/1950 | Greaves et al. | 156/275 |
| 2,622,053 | 12/1952 | Clowe et al. | 156/252 X |
| 2,927,879 | 3/1960 | Jones | 156/275 |
| 3,961,103 | 6/1976 | Aisenberg | 427/34 X |
| 4,245,003 | 1/1981 | Oransky | 428/408 X |
| 4,436,797 | 3/1984 | Brady et al. | 428/408 X |

Primary Examiner—P. C. Ives
Attorney, Agent, or Firm—William H. Calnan

[57] ABSTRACT

Substrates, especially highly thermally expandable materials, such as plastics are adherently coated with a relatively soft layer comprising carbon and thereafter with a relatively harder layer of diamond-like carbon to provide coated articles that are abrasion resistant, electrically insulating, and resistant to chemical attack. If the substrate is transparent, the protectively coated article is transparent too.

17 Claims, 1 Drawing Figure

ARTICLES COATED WITH ADHERENT DIAMONDLIKE CARBON FILMS

FIELD OF THE INVENTION

This invention relates to hard coatings, particularly for plastics and other relatively soft substrates. More particularly, it relates to a method of adhering a protective layer of diamondlike carbon to comparatively soft substrates to provide a transparent, electrically insulating coating thereon.

BACKGROUND OF THE INVENTION

Hard, thin films of diamondlike carbon have been deposited on metal and glass substrates in a number of ways. By "diamondlike carbon" is meant carbon with exceptional hardness, e.g., can neither be cut with a razor blade, nor scratched by rubbing with 000 steelwool, high refractive index, e.g., $\geqq 2.0$, and high electrical resistivity. The chemical bonding appears to be dominated by $sp^3$ tetrahedral diamondlike bonding as opposed to the $sp^2$ trigonal bonding of graphite. Diamondlike carbon films may or may not give evidence of crystallinity by x-rays. Diamondlike carbon films also have a relatively low hydrogen content, the infrared absorption due to C-H bond-stretching at about 2900 $cm^{-1}$ being absent, or relatively weak, and the hydrogen content being relatively low when measured by conventional techniques, e.g., secondary ion mass spectrometry (SIMS). Depending on deposition conditions, less hard films comprising carbon have also been deposited on metal and glass substrates. In constrast to diamondlike carbon, these films are easily scratched by a razor blade or by rubbing with steel wool, they have a lower refractive index, e.g., $\leqq 1.5$, and a relatively lower electrical resistivity. They also have a higher hydrogen content than diamondlike carbon films, the infrared absorption due to C-H bond-stretching at about 2900 $cm^{-1}$ being very strong, and the hydrogen content being relatively high by SIMS.

The thermal decomposition of hydrocarbon gas, e.g., methane, has been reported to deposit carbon in the form of diamond on a diamond substrate, but no specific evidence was presented (Eversole, U.S. Pat. Nos. 3,030,187, and 3,030,188). Aisenberg, U.S. Pat. No. 3,961,103, used an ion beam of 40 eV energy to direct ionized carbon and argon at a substrate, but crystallographic studies were inconclusive. Ion impact films formed in a direct current (dc) plasma system comprising ethylene and argon are disclosed in Whitmell and Williamson, Thin Solid Films, 35 (1976), p 255, and the films comprise hard carbon on a metal cathode substrate. Films formed in a dc glow discharge plasma comprising acetylene are described by Meyerson and Smith, Journal of Non-Crystalline Solids, 35 and 36 (1980) 435–440 to comprise hydrogenated amorphous carbon. Ion impact carbon films deposited in a radio frequency (rf) generated plasma using butane at $10^{-1}$ Torr and a 180 Watt power input are described by L. Holland, U.K. Provisional Patent Application No. 33794 (1976) to have insulating properties. Hiratsuka, Akovali, Shen and Bell, Journal of Applied Polymer Science, Vol. 22, 917–925 (1978) polymerized methane, ethane, propane and n-butane in a plasma created by a rf glow discharge on either aluminum or sodium chloride plate and obtained C-H films. Substrate sputtering is also known to produce films of carbon on gold, aluminum and silicon, as reported by Ojha and Holland, Proc. 7th Int. Vacuum Congr. and 3rd Int. Conf. on Solid Surfaces, Vienna, 1977, p 1667. The most facile and widely applicable methods are carbon ion beam deposition and rf plasma decomposition of hydrocarbon gases. Such methods are discussed in Vora and Moravec, "Structural Investigation of Thin Films of Diamondlike Carbon" J. Appl. Phys., 52:10, pp. 6151–6157 (1981), Moravec and Lee, "Investigation of Mechanically Hard, Chemically Inert Antireflection Coatings for Photovoltaic Solar Modules", SERI Contract No. XS-0-9010-3 Progress Report, Nov. 30, 1980. 4 pp., and Holland and Ojha, "The Growth of Carbon Films With Random Atomic Structure From Ion Impact Damage In a Hydrocarbon Plasma," Thin Solid Films, 58, pp. 107–116 (1979). As reported in Vora and Moravec, films produced by these methods are observed to undergo an abrupt transition from soft (easily scratched by a razor blade) to hard (resistant to scratching by a razor blade) with increase in the ratio of rf power to deposition pressure. The value of this ratio of transistion was about 100 Watts/Torr.

In the present state of the art, thin carbon films have been successfully applied to refractory substrates, such as metal, glass and ceramic as wearresistant coatings, but the same films applied to less rigid, less thermally stable substrates such as acrylic, polyvinyl chloride (PVC), polycarbonate and other plastics fail to adhere to the surface, thus severely limiting the use of such thin films as protective coatings.

While tendency for the carbon films to separate from plastic surfaces is not wholly understood, it may be at least partially attributable to the substantial differences in coefficients of thermal expansion for hard carbon films versus plastics: Carbon (graphite) has a coefficient of thermal expansion (CTE) on the order of $1.3-1.5 \times 10^{-6} in/in/°$ F.; acrylics, PVC and polycarbonate have a CTE on the order of $10-50 \times 10^{-6} in/in/°$ F., and soda/lime glass has a CTE of about $4.8-5.1 \times 10^{-6} in/in/°$ F. Consequently, a means of improving the adhesion of diamondlike carbon films to relatively highly expandable/contractable and even flexible substrates, e.g., plastics, is of great interest to the protective coating art.

SUMMARY OF THE INVENTION

It has now been discovered that by interposing a relatively soft layer comprising carbon between the surface of a substrate and a film comprising diamondlike carbon, excellent adhesion of the outer coating is attained without sacrificing any of the hard surface properties. Using a deposition technique such as radiofrequency (rf) plasma decompositon of a hydrocarbon gas, an intermediate layer and a protective layer of carbon in two slightly different forms can be applied using the same feed gas, in the same operation, to provide a coated substrate having an outer surface coating of diamondlike carbon which is mechanically hard, electrically insulating, chemically inert, and optically clear.

Accordingly, it is an object of the present invention to provide a novel hard, protective coating for substrates, especially plastic-like substrates.

It is a further object of the present invention to provide a means of applying adherent thin films comprising diamondlike carbon to substrates, especially plastic-like substrates.

It is a further object of the present invention to provide an adherent coating for substrates, especially plastic-like substrates, which is transparent, electrically insulating, abrasion resistant and resistant to chemical attack.

These and other objects are accomplished herein by an article comprising
 (i) a solid substrate,
 (ii) an intermediate, relatively soft layer adjacent at least one surface of said substrate, said layer comprising carbon, and
 (iii) adjacent said intermediate layer an outer, relatively hard, protective layer comprising diamondlike carbon.

In preferred embodiments, intermediate layer (ii) comprises carbon and hydrogen, is approximately 100 to 5000 Angstroms in thickness and can be scratched by rubbing with steel wool. In another preferred embodiment, outer, protective layer (iii) comprises carbon, is approximately 1000 to 20,000 Angstroms in thickness and cannot be scratched by rubbing with steel wool. In still another preferred feature, intermediate layer (ii) comprises carbon and hydrogen, is approximately 100 to 5000 Angstroms thick and can be scratched with steel wool, and outer, protective, layer (iii) comprises carbon, alone, or combined with hydrogen, is approximately 1000 to 20,000 Angstroms thick and cannot be scratched by steel wool, and the amount of hydrogen relative to carbon is nil or at most substantially less in layer (iii) than in layer (ii).

Also contemplated is a method for applying adherent thin films of diamondlike carbon to solid substrates comprising
 (i) depositing a first, thin, relatively soft film comprising carbon on at least one surface of a substrate, and
 (ii) depositing on said first thin film a second, thin, relatively hard film comprising diamondlike carbon.

In preferred features, the surface of a substrate will be coated with a relatively soft intermediate layer comprising carbon about 100 to 5000 Angstroms in thickness of rf plasma decomposition of a hydrocarbon gas such as methane, ethane, propane, butane, acetylene, benzene, etc. at low rf power to pressure ratios, i.e., below 100 Watts/Torr, and then coated with a relatively hard layer comprising diamondlike carbon of about 1000 to 20,000 Angstroms in thickness at an increased rf power to pressure ratio of above 100 Watts/Torr.

For the purposes herein, the difficult to protect substrates include any hard or relatively less hard or even flexible material, as contrasted to metals, glass or ceramics, to which hard surface coatings of carbon fail to adhere. Such substrates include but are not limited to plastics generally, especially acrylics, polyvinyl chloride, polycarbonates, and the like.

BRIEF DESCRIPTION OF THE DRAWING

The drawing is a schematic illustration of an apparatus for depositing carbon films by radio-frequency plasma decomposition of hydrocarbon gases.

DETAILED DESCRIPTION OF THE INVENTION

Figure 1:
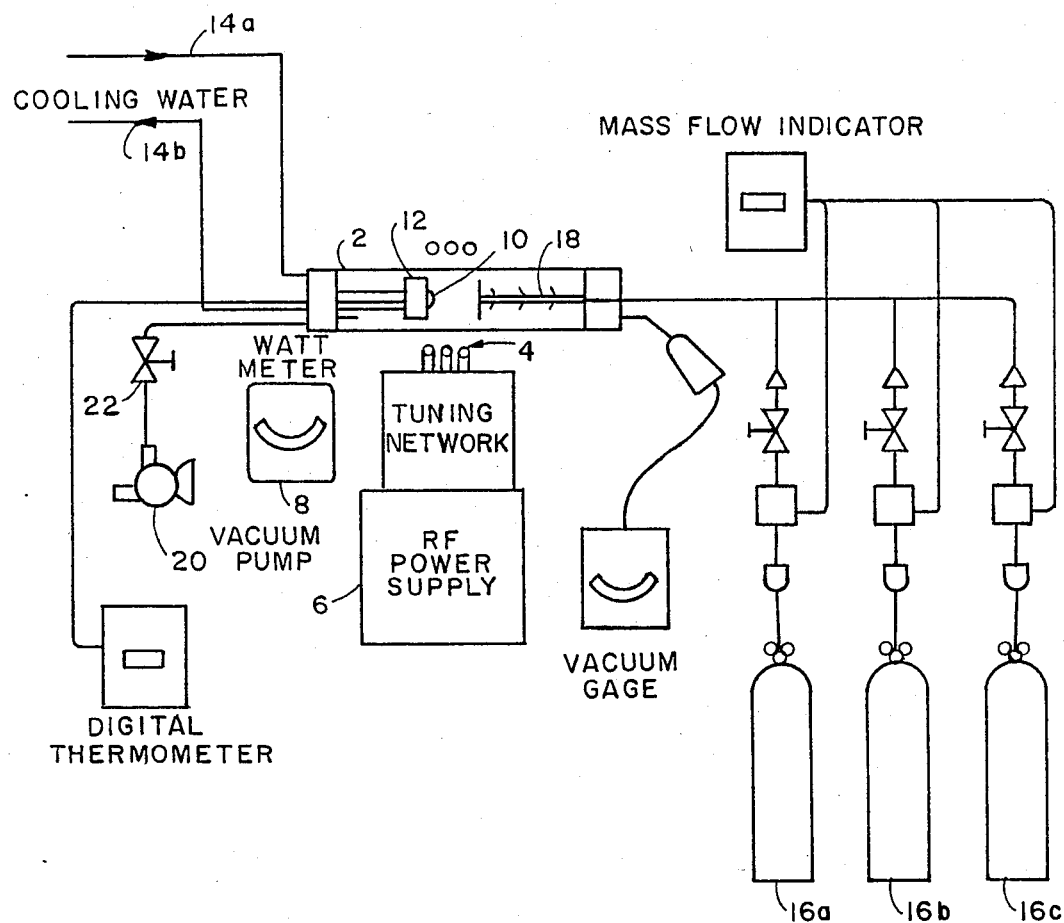

The protectively coated articles of the present invention are produced by depositing two layers comprising carbon, one relatively soft and one very hard, on the surface of a difficult to protect substrate which characteristically rejects or loses adhesive contact with a directly deposited single, hard layer of diamond-like carbon. By interposing a relatively softer layer comprising carbon, e.g., one which contains a relatively high concentration of hydrogen, between the substrate and a diamondlike carbon layer, protectively coated substrates exhibiting excellent adhesion of the hard coating and retaining the excellent physical properties of such hard carbon coatings are obtained.

The substrates which are contemplated herein are materials which characteristically do not successfully maintain adhesive contact with hard carbon films that are applied to them in various ways, such as by carbon ion beam deposition or radio-frequency plasma decomposition. Such materials include salt, e.g., NaCl plates, and natural polymers. The substrates often have coefficients of thermal expansion substantially greater than that of hard carbon/low hydrogen content forms, however, it is contemplated that other materials having coefficients of thermal expansion close to that of hard carbon may be found which adherently accept diamondlike carbon films only by interposition of a relatively soft, high hydrogen-content carbon film in accordance with the present discovery. Some experimentation, therefore, is contemplated in discovering the entire range of substrates suitable for the purposes herein.

Substrates which are especially contemplated herein are transparent and non-transparent plastics, that is, synthetic organic polymers including acrylics, e.g., polymers and copolymers of acrylic acid, methacrylic acid, esters of these acids, or acrylonitrile, particularly poly(methyl methacrylate) and materials known under such tradenames as Lucite ®, Plexiglas ®, and Acrylite ®; polycarbonates, particularly poly(bisphenol-A carbonate) and materials sold under such tradenames as Merlon ® and Lexan ®; polyesters, e.g., poly(ethylene terephthalate), poly(butylene terephthalate), and the like; polyamides; polyimides; styrene-acrylonitrile copolymers; styreneacrylonitrile-butadiene terpolymers; polyvinyl- and vinylidene-halide polymers and copolymers, especially polyvinyl chloride (PVC), polyvinyl butyratres, polyethylene; and the like.

According the present invention a film of soft carbon is first deposited adjacent the surface of the substrate. This layer acts as a bonding layer between the substrate and the hard film comprising diamondlike carbon which is the overlayer. The carbon of this bonding layer usually will have a brown or yellowish tint, but it is transparent to visible light. Preferably the thickness of this thin bonding layer of carbon is from about 100 to 5000 Angstroms, although any thickness which enhances the adhesion between a nonrigid substrate and the hard outer film comprising diamondlike carbon is contemplated.

Adjacent the soft film comprising carbon is deposited a protective, hard film comprising diamondlike carbon. This outer film contributes the hard, insulating, inert properties which make diamondlike carbon films desirable as protective, high-performance coatings. Preferably the outer film comprising diamondlike carbon will be about 1000 to about 20,000 Angstroms in thickness.

Since the bonding layer and outer hard layer described above are composed of the same material, i.e., carbon, differing in degree of hydrogen content and hardness, the two layers may advantageously be applied as part of the same operation by varying the conditions under which the carbon is deposited on the substrate, without handling or manipulating the substrate until both coatings are in place.

Although other known methods of depositing thin carbon films can be used in the practice of this invention, radio-frequency plasma decomposition of a hydrocarbon gas, also known as "glow discharge", is the process most preferred. Energy to the plasma can be fed by capacitative or inductive coupling. As seen in the drawing, a typical inductively coupled rf plasma reactor, reaction tube 2 lies on the axis of tuning network coil 4 which is connected to rf power supply 6. Watt meter 8 monitors the power level. Substrate 10 to be coated is placed against heat sink 12, which is cooled, for example by conduits 14a and 14b for passage of water. A hydrocarbon gas, e.g., methane, ethane, propane, butane, benzene, acetylene, or the like, is introduced through valves and meters from any of tanks 16a, 16b or 16c, to tube 2 through diffuser 18. Reaction tube 2 is evacuated by vacuum pump 20 to control the deposition pressure within the system, using throttle valve 22. A plasma of carbon and hydrogen ions and electrons forms between the electrodes, and the carbon ions impinge on the heat sink 12 and substrate 10. A radio frequency power to deposition pressure ratios below about 100 Watts/Torr, soft carbon films are deposited. Above about 100 Watts/Torr hard, diamondlike carbon films are deposited.

Those skilled in the art will better understand the practice of the present invention by considering the following examples, which are included for illustration and not by way of limitation.

EXAMPLE 1

A ⅛"×1"×1" sample of Acrylite ® poly (methyl methacrylate) (Cyro Industries) was cleaned ultrasonically in xylene for two minutes, then rinsed with isopropanol and air dried. The plastic sample was fastened to a water-cooled aluminum heat sink and placed in a quartz vacuum tube (50 mm internal diameter). A vacuum of 0.15 Torr was established, and acetylene gas introduced at a flow rate of 0.5 cc/min. Five Watts radio frequency power at 13.56 MHz was applied for 5 minutes to yield a relatively soft film comprising carbon, approximately 700 Angstroms thick. A vacuum of 0.08 Torr was established with a mixed feed gas of acetylene flowing at 0.5 cc/min. and nitrogen flowing at 0.1 cc/min. Twenty Watts rf power at 13.56 MHz produced a hard film comprising diamondlike carbon approximately 1500 Angstroms thick as an outer layer.

The deposited films had a light brown color but were transparent. The coated substrate was rubbed with hand-held 000 steel wool without evidence of scratching. Scotch ® transparent tape was applied to the coated surface, pressed in place, then pulled away at a 90° angle; the film comprising diamondlike carbon remained intact, indicating good adhesion. In contrast, if an intermediate layer was not deposited, adhesion was poor.

EXAMPLE 2

A ⅛"×1"×1" sample of polyvinyl chloride sheeting was washed with soap and water, ultrasonically cleaned in isopropanol, and air dried. The sample was then placed in an apparatus as shown in the drawing and subjected to a radio frequency glow discharge treatment for 10 minutes at 30 Watts rf power, with a vacuum of 0.5 Torr and an oxygen feed gas. The sample was then overcoated as in Example 1 to provide a hard diamond-like carbon film over a softer carbon film.

There was produced a coated substrate showing similar abrasion resistance and coating adhesion.

The above-mentioned patents and publications are incorporated herein by reference. Variations and modifications in the present invention will be obvious in light of the foregoing disclosure. For example, the deposition technique, the composition of the feed gas, i.e., whether pure hydrocarbon gas or a mixture of gases, the residence time of samples, feed rates, etc. may be varied according to the particular needs of those practicing the present invention. All such modifications, however, are within the full intended scope of the invention as defined by the appended claims.

What is claimed is:

1. An article comprising:
   (i) a solid substrate;
   (ii) an intermediate layer adjacent at least one surface of said substrate, said layer comprising carbon which can be scratched by rubbing with steel wool; and
   (iii) adjacent said intermediate layer an outer protective layer comprising diamondlike carbon.

2. An article as defined in claim 1 wherein said intermediate layer (ii) comprises carbon and hydrogen, is approximately 100 to 5000 Angstroms in thickness.

3. An article as defined in claim 1 wherein said outer, protective layer (iii) comprises carbon, is approximately 1000 to 20,000 Angstroms in thickness.

4. An article as defined in claim 1, wherein said intermediate layer (ii) comprises carbon and hydrogen, is approximately 100 to 5000 Angstroms in thickness, and can be scratched by steel wool, and said outer protective layer (iii) comprises carbon and hydrogen, is approximately 1000 to 20,000 Angstroms in thickness, and which cannot be scratched by rubbing with steel wool, the amount of hydrogen relative to carbon being nil or substantially less in layer (iii) than in layer (ii).

5. An article as defined in claim 1, wherein said substrate (i) is comprised of plastic.

6. An article as defined in claim 5, wherein said plastic is a synthetic organic polymer selected from the group consisting of acrylics, polycarbonates, polyesters, polyamides, polyimides, styrene-acrylonitrile copolymers, styrene-acrylonitrile-butadiene terpolymers, and vinyl halide polymers.

7. An article as defined in claim 6, wherein said synthetic organic polymer is transparent.

8. An article as defined in claim 7, wherein said synthetic organic polymer is selected from the group consisting of poly(methyl methacrylate), polycarbonate, and polyvinyl chloride.

9. A protectively coated article comprising:
   (i) a solid substrate having a coefficient of thermal expansion substantially greater than diamondlike carbon;
   (ii) an intermediate bonding layer of carbon adjacent at least one surface of said substrate which layer can be scratched by rubbing with steel wool; and
   (iii) an outer protective layer of diamondlike carbon adjacent said intermediate bonding layer, wherein said outer layer is adherently bonded to said substrate by said intermediate layer.

10. An article as defined in claim 9 wherein said intermediate layer (ii) comprises carbon and hydrogen, is approximately 100 to 5000 Angstroms in thickness.

11. An article as defined in claim 9 wherein said outer, protective layer (iii) comprises carbon, is approximately 1000 to 20,000 Angstroms in thickness.

12. An article as defined in claim 9, wherein said intermediate layer (ii) comprises carbon and hydrogen, is approximately 100 to 5000 Angstroms in thickness, and said outer protective layer (iii) comprises carbon alone, or in combination with hydrogen, is approximately 1000 to 20,000 Angstroms in thickness, the amount of hydrogen relative to carbon being nil or substantially less in layer (iii) than in layer (ii).

13. An article as defined in claim 9, wherein said substrate is comprised of plastic.

14. An article as defined in claim 13, wherein said plastic is a synthetic organic polymer selected from the group consisting of a acrylics, polycarbonates, polyesters, polyamides, polyimides, styrene-acrylonitrile copolymers, styrene-acrylonitrile-butadiene terpolymers, and vinyl polymers.

15. An article as defined in claim 14, wherein said synthetic organic polymer is transparent.

16. An article as defined in claim 15, wherein said synthetic organic polymer is selected from the group consisting of poly(methyl methacrylate), polycarbonate, and polyvinyl chloride.

17. An article comprising:
(i) a solid substrate which characteristically does not maintain adhesive contact with a hard carbon film applied thereto;
(ii) an intermediate layer of carbon adjacent at least one surface of said substrate, which layer can be scratched by rubbing with steel wool; and
(iii) adjacent said intermediate layer an outer protective layer comprising diamondlike carbon.

* * * * *